United States Patent [19]
Ishitani et al.

[11] Patent Number: 5,852,297
[45] Date of Patent: Dec. 22, 1998

[54] FOCUSED ION BEAM APPARATUS AND METHOD FOR IRRADIATING FOCUSED ION BEAM

[76] Inventors: Tohru Ishitani, Hitachi Wing 230, 11-1 Aoba-cho; Tsuyoshi Ohnishi, Tsukubadai Apartment 3-202, 663, Ichige, both of Hitachinaka-shi, Ibaraki 312, Japan

[21] Appl. No.: 620,764

[22] Filed: Mar. 22, 1996

[30] Foreign Application Priority Data

Mar. 24, 1995 [JP] Japan ..................................... 7-065511

[51] Int. Cl.⁶ ................................................. H01J 37/317
[52] U.S. Cl. ..................................... 250/492.21; 250/309
[58] Field of Search ............................... 250/492.21, 398, 250/397, 309

[56] References Cited

U.S. PATENT DOCUMENTS 5,120,925   6/1992   Ohnishi et al. ..................... 250/492.21
5,270,552  12/1993   Ohnishi et al. ..................... 250/492.21
5,504,340   4/1996   Mizumura et al. ................. 250/492.21

OTHER PUBLICATIONS

Journal "Vacuum Science and Technology B", vol. 8, No. 6, Nov/Dec 1990, pp. 1673–1675 (see Specification p. 2).

*Primary Examiner*—Bruce Anderson
*Attorney, Agent, or Firm*—Kenyon & Kenyon

[57] ABSTRACT

An optical system, wherein the total optical path length from the tip of the emitter of the ion source to the surface of the sample is in a range of from 300 to 450 mm, distance from the ion source to the condenser lens center is in a range of from 15 to 45 mm, and distance from the objective lens center to the sample is in a range of from 10 to 40 mm, is installed in an FIB apparatus in order to realize milling of fine elements to higher accuracy at higher speed and image observation in higher resolution in failure analysis and process evaluation of fine elements such as semiconductors.

5 Claims, 5 Drawing Sheets

FOCUSED ION BEAM APPARATUS AND METHOD FOR IRRADIATING FOCUSED ION BEAM

BACKGROUND OF THE INVENTION

The present invention is related to a focused ion beam (FIB) apparatus.

At present, focused ion beam apparatus is used in various fields. In particular, the apparatus is used for applications in a micro area because its fine focused beam can be applied to an extremely small area. The focused ion beam apparatus, which focuses an ion beam from an ion source through a lens and irradiates the beam onto a sample, is also used for milling and observing a sample in a micro area. For example, it is possible to use the apparatus for observation of a sample by irradiating an ion beam of relatively low current onto the sample and detecting secondary particles to be generated from the sample. Further, it is possible to mill a sample by irradiating an ion beam of relatively high current onto the sample.

The focused ion beam is also used for failure analysis of semiconductors. Semiconductors have been integrated recent years, and they have a layered structure. For this reason, to inspect a semiconductor, it is necessary to expose a required layer and then inspect the surface condition of the layer. Because the focused ion beam is applicable to both milling and observation, it is suitable for failure analysis of semiconductors. First, increase current of the ion beam and mill from the surface down to a required layer of a semiconductor. Then, decrease current of the ion beam and inspect the surface condition of the layer.

One of the prior art techniques relating to a focused ion beam apparatus is described in Journal "Vacuum Science and Technology B", Vol. 8, No. 6, Nov/Dec, 1990, pp. 1673–1675. According to the description, the total optical ion-beam path length Lt from the tip of the ion emitter of the ion source 1 to the sample 10 is 275 mm. Distance Lo from the ion source to the condenser lens center is 25 mm, distance L from the condenser lens center to the objective lens center is 220 mm, and distance Li from the objective lens center to the sample is 30 mm.

A focused ion beam apparatus is associated with a problem in the milling mode that, if the focused ion beam is not fine enough, the beam cannot mill a fine pattern of a semiconductor in failure analysis. Another problem in the milling mode is that milling speed decreases if current of the ion beam is not high enough. When a sample is milled for a long time, the beam position is affected by drift of the sample stage, and accordingly the focused beam cannot be fit to a fine pattern of a semiconductor.

In the observing mode, on the other hand, the focused ion beam apparatus is associated with another problem that, if the focused ion beam is not fine enough, the apparatus cannot observe a fine pattern of a semiconductor in failure analysis. Another problem in the observing mode is that, if current of the ion beam is not high enough, attained signals are too low to detect an image with sufficient S/N ratio.

In the prior art as described above, the focused ion beam apparatus does not solve these problems and it is impossible to use the apparatus for failure analysis of semiconductors. For example, it is virtually impossible to carry out failure analysis of 64M byte DRAM (pattern width of 0.4 to 0.3 micrometer) which is one of the best selling semiconductors.

Further, it is absolutely impossible to carry out failure analysis of 256M byte DRAM (pattern width of 0.25 micrometer) which is also one of the best selling semiconductors.

SUMMARY OF THE INVENTION

The object of the present invention is to furnish a focused ion beam apparatus that enables to carry out failure analysis of semiconductors with fine patterns.

The inventor of the present invention has repeated analyses and experiments on failure analysis of semiconductors, particularly on ion beam diameter and ion beam current and found out that the following conditions are required for failure analysis of semiconductors, particularly, 64M byte DRAM and 256M byte DRAM.

In short, the inventor has found out that the ion beam for milling must have the maximum current intensity $Jmax \geq 15$ $A/cm^2$ and that the ion beam for milling must satisfy $DP \leq 40$ nm at Ip=several tens of pA and the ion beam for observation ($Ip \geq 1$ pA) must satisfy $DP \leq 15$ nm.

To achieve the above, that is, to realize failure analysis of semiconductors which is the object of the present invention, components of the focused ion beam apparatus of the present invention, which comprises an ion source, a condenser lens for focusing ion beam from said ion source, and an objective lens, are arranged so that the total optical path length from the tip of the emitter of said ion source to said sample is within a range of from 300 to 450 mm and distance from said objective lens center to said sample is 40 mm or less.

With the arrangement as described above, the focused ion beam realizes the maximum current intensity $Jmax \geq 15$ $A/cm^2$, $DP \leq 40$ nm at Ip=several tens of pA in the milling mode, and $DP \leq 15$ nm for the ion beam for observation ($Ip \geq 1$ pA). Accordingly, it becomes possible for the focused ion beam to be used for analyzing semiconductors, in particular, 64M byte DRAM and 256M byte DRAM.

DETAILED DESCRIPTION OF THE PREFERRED EMBODIMENTS

Preferred embodiments of the present invention will be described hereinafter with reference to the drawings.

Figure 1:
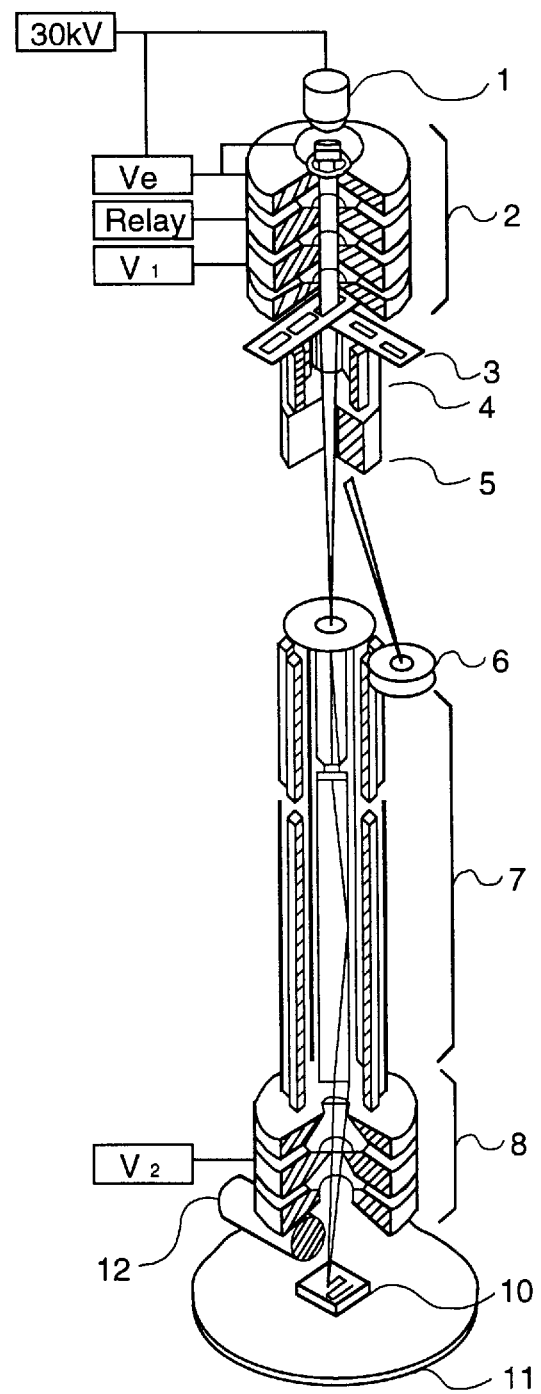
FIG. 1 shows the construction of the optical ion beam system of the focused ion beam apparatus in the present invention.

FIG. 1 is an assembly drawing showing the brief structural elements of the ion optical system of the FIB apparatus. The ion source 1 is a liquid metal ion source (LMIS) using high brightness gallium (Ga). The ion emitted from the ion source 1 is focused onto the sample 10 by the condenser lens 2 and objective lens 8. Beam diameter of Focused ion beam (FIB) 9 is defined by the beam defining aperture 3 located immediately after the condenser lens 2, and the beam is scanned on the sample 10 by the electrostatic deflector 7. Although the lens center must generally be defined at a position where the lens effect becomes the highest, that is, at the center between each principal plane of the front and rear lenses, the lens center in this description is defined by approximation using thin lenses. (Practically speaking, the condenser lens in this disclosed prior art consists of four electrodes with 10 mm gap between each electrode. The condenser lens center is defined to be located at the position of the third electrode from the ion source. The objective lens consists of three electrodes with 10 mm gap between each electrode, and the objective lens center is defined to be located at the position of the middle electrode.)

Mode change by switching the condenser lens is as follows. Two different focusing modes are available by switching the second and third electrodes of the condenser lens; that is, (a) high current intensity beam mode for FIB milling and (b) fine beam mode for image observation by a scanning ion microscope (SIM).

Figure 2:
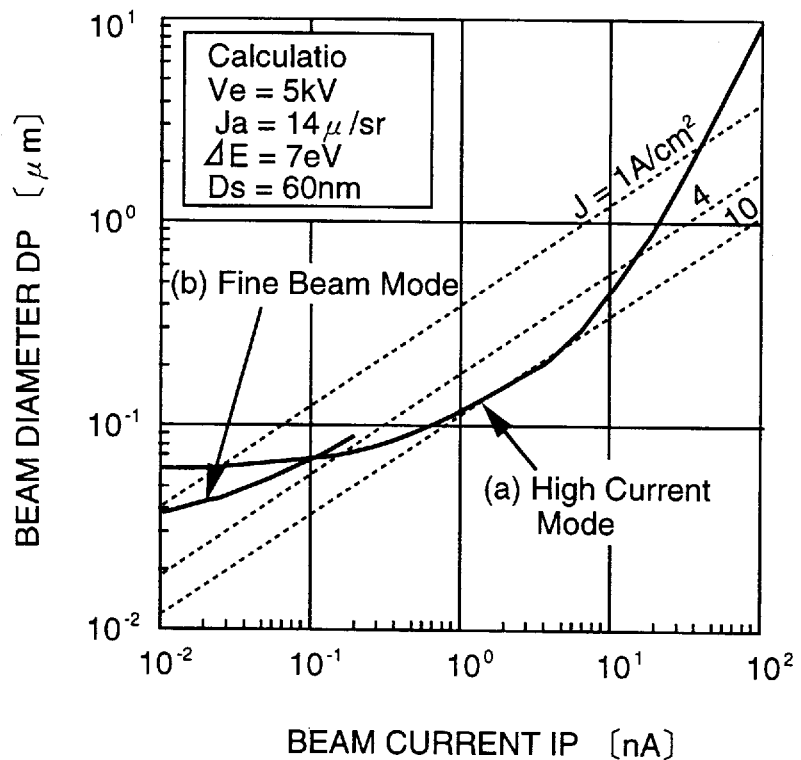
FIG. 2 shows a relation curve of beam diameter versus beam current (Dp-Ip) in the present invention.

To differentiate the embodiment of the present invention more clearly, detailed description of the prior art is given below. In the prior art, the total optical ion beam path length from the tip of the ion emitter of the ion source 1 to the sample 10 is 275 mm, wherein distance Lo from the ion source to the condenser lens center is 25 mm, distance L from the condenser lens center to the objective lens center is 220 mm, and distance Li from the objective lens center to the sample is 30 mm. FIG. 2 shows a curve of beam diameter Dp versus beam current Ip for both the FIB milling mode and SIM image observing mode. Calculation is done on condition that the ion extraction voltage Ve is 5 kV, angular ion intensity Ja is 14 $\mu$A/sr, ion energy width $\Delta$E is 7 eV, virtual source size Ds is 60 nm, and ion accelerating voltage Vi onto the sample is 30 kV. In the FIB milling mode, the milling beam diameter Dp is switched from large to small in a range of 50 nm to 1 $\mu$m, depending upon the area to be milled, to conduct rough, medium, and fine milling.

Accordingly, the focused ion beam apparatus in the prior art is summarized as follows.

(1) The maximum current intensity Jmax of the milling beam is about 10 A/cm$^2$.

(2) The beam diameter Dp of the milling beam having Ip=several tens of pA is 60 to 70 nm.

(3) In the fine beam (observation) mode, a beam with Dp=35 nm can be formed at Ip=10 pA.

Figure 3A:
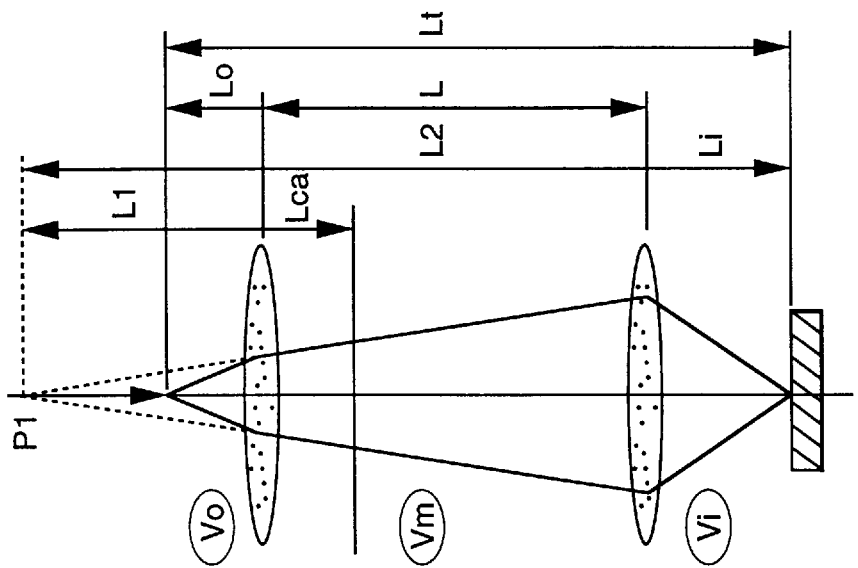
FIGS. 3A and 3B shows a schematic diagram of the optical ion beam system in the present invention.
Figure 3B:
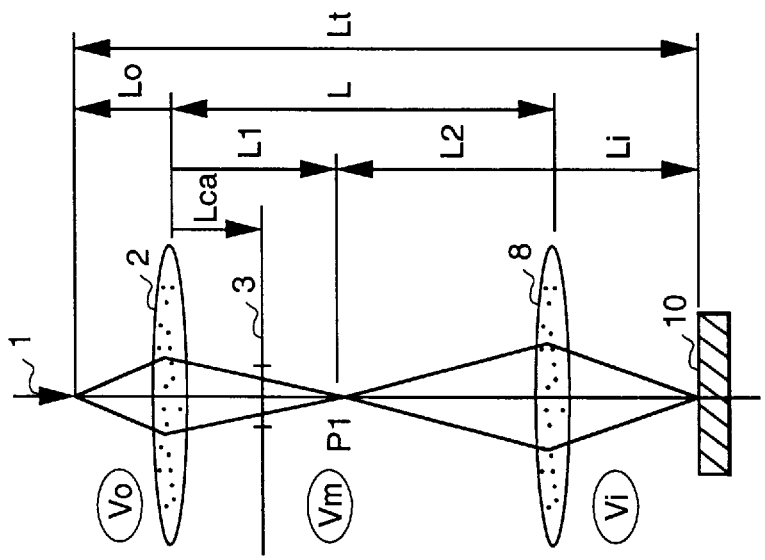

Beam focusing by the ion beam optical system in the FIB apparatus, which is an embodiment of the present invention, will be described hereinafter with reference to a figure. The optical system is a two-lens system, wherein distance from the condenser lens center to the tip of the ion emitter is defined as Lo, distance from the condenser lens center to the objective lens center is as L, and distance from the objective lens center to the sample is as Li. The sum of these distances (Lo+L+Li) is defined as the total optical path length Lt. Distance from the condenser lens center to the beam defining aperture is defined as P1. The tip of the ion emitter is defined as the object point of the condenser lens and the image point of the condenser lens is defined as P1. Distance from the condenser lens center and objective lens center to the image point P1 is defined as L1 and L2 (=L-L1), respectively. Sign of L1 is positive for a real image and negative for a virtual image. In particular, when the image point P1 is positioned between the two lenses, it is called the crossover mode, and when P2 is positioned out of the two lenses, it is called the collimating mode. FIGS. 3(a) and 3(b) shows the crossover mode and collimating mode, respectively. The latter shows how the beam is focused when the image point P1 is positioned on the ion source side.

Potential at the ion source side is defined as Vo (=ion extraction potential Ve), between the lenses is defined as Vm, and at the sample is defined as Vi, where Vm=Vi. According to common practices in optical system analysis, however, the origin of the potential is set at the ion emitter. On an apparatus in practical application, the sample is normally at the earth potential and ion accelerating voltage is applied to the ion emitter. When the ion source is Ga-LMIS, practical potential value is Vo (=Ve)=6 to 10 kV, and Vi (=Vm) is set above 20 kV for more effective ion sputtering.

Figure 4:
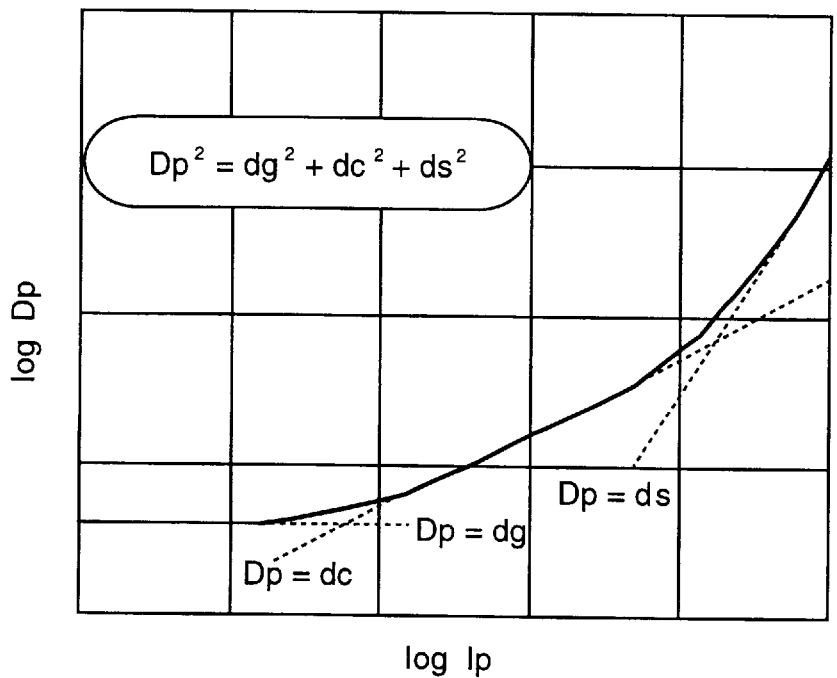
FIG. 4 shows common relation curve of beam diameter versus beam current (Dp-Ip).

Before optimizing the optical path length (Li, Lo, L, L1/L2, and Lca), result of analyzing the relationship between the beam characteristics (Dp-Ip curve) and the optical path length will be given. The lenses are analyzed by approximation using thin lens FIG. 4 shows a normal Dp-Ip characteristic curve that is attained when the optical path length and potential are fixed and the beam half-angle $\alpha$o on the incidence side of the condenser lens constituting the FIB is changed. The beam diameter Dp is expressed as follows using the Gaussien image size dg, deviation of image due to chromatic aberration dc, and deviation of image due to spherical aberration ds.

$$Dp^2 = dg^2 + dc^2 + ds^2 \quad (1)$$

where dg, dc, and ds can be expressed as follows, respectively, using the lens magnification Mt, virtual source size Ds, and chromatic and spherical aberration coefficients (Cc and Cs, respectively).

$$dg = Mt\, Ds \quad (2)$$

$$dc = \alpha o Hc\, \Delta V \quad (3)$$

$$ds = (\tfrac{1}{2})\, Mt\, Cs\, \alpha o^3 \quad (4)$$

where $$Hc = Mt\, Cc/Vo \quad (5)$$

$$Mt = Mc1\, Mo1 = (Vo/Vi)^{1/4}(Li/Lo)(L1/L2) \quad (6)$$

$$Mc1 = (Vo/Vi)^{1/4}(L1/Lo) \quad (6\text{-a})$$

$$Mo1 = (Li/L2) \quad (6\text{-b})$$

Here, $\Delta$V is a voltage converted from $\Delta$E and Vo is the ion extraction voltage. Hc is a proportional term determined only by the optical path length and potential of the optical system in dc. Mc1 and Mo1 are the lens magnification of the condenser lens and objective lens, respectively.

On the other hand, Ip is expressed by the following equation using Ja and $\alpha$o, the beam half-angle defined at source side.

$$Ip = Ja(\pi \alpha o^2) \quad (7)$$

When the Dp-Ip characteristic curve is plotted on a full logarithmic scale sheet, the characteristic curve shows the following three features.

(1) The characteristic curve can be extrapolated by three straight lines Dp=dg, Dp=dc and Dp=ds in the small, medium and large domain of value Ip, respectively, and gradient of the lines is 0, 1/2 and 3/2, respectively.

(2) The minimum value of Dp is dg. (3) In the domain where Dp=dc, the current intensity J of the FIB becomes maximum, and Jmax on this occasion is expressed as follows.

$$Jmax=(4Ja/\Delta V^2)/|Hc| \quad (8)$$

Since the small and medium domains of value Ip are used normally, descriptions hereunder will refer only to these two domains.

First, in the analysis, the ion source operating conditions (Ja, Ds, and $\Delta V$), voltages (Vo, Vm, Vi (=Vm)) and optical path lengths (Lo, L, and Li) are all handled as constant to calculate Hc and Mt, which govern the beam characteristic, as a function of these constants. Then, optimization of the optical path length is studied in view of improving the characteristic. Analysis of the ion beam is separated into analyses of the milling beam and the observation beam, and the results are given separately. Then, position of the beam defining aperture is examined in relation to the latter result.

(1) Milling beam

Increasing Jmax of the milling beam means nothing but optimizing the set position of the image point P1, that is, optimizing L1/L2 to minimize |Hc|. The optimized value of L1/L2 is expressed by the equation 9 using the average voltage of the condenser lens and objective lens (Vavc and Vavo, respectively) (Deductive expressions used in the course of calculation are omitted). Hc and Mt are expressed by the equations 10 and 11, respectively, where it is assumed that Lo<L and Li<L.

$$L1/L2 = \pm[(Lo/Li)(Vavc/Vavo)]^{1/2} \quad (9)$$

$$Hc = \pm 4[(Vo/Vi)^{1/4}(LiLo)]^{1/2}/(Vavc \cdot Vavo)^{1/2} \quad (10)$$

$$Mt = \pm 4(Vo/Vi)^{1/4}(Li/Lo)^{1/2}/(Vavc/Vavo)^{1/2} \quad (11)$$

In the equation, positive sign and negative sign correspond to the crossover mode and collimating mode, respectively, as to how the beam is focused. From the Dp-Ip characteristic curve where the image point is optimized as above, the following analytical result is obtained.

(1) Set the image point at a position satisfying the equation 9.

(2) To increase Jmax, decrease |Hc|, that is, decrease LoLi.

(3) To decrease Dp of the fine milling beam, decrease Mt, that is, decrease Li/Lo.

(4) The optimized characteristic curve is susceptive to Lo and Li but less susceptive to L (because Vavc and Vavo are less susceptive to any change in Li, Lo and L).

(2) Observation beam

In this analysis, efforts are made to secure Ip=several pA and make the diameter as small as Dp≦15 nm. For this purpose, the image point P1 is shifted from the optimizes position attained for the milling beam without changing the lens voltage and the lens magnification |Mt| is decreased. It is advantageous to use a beam near the intersection of the straight lines Dp=dg and Dp=dc (Dp≈($\sqrt{2}$)dg) in the Dp-Ip curve of the observation beam (see FIG. 4). As a result, condition of |Mt| is attained from the equation 2.

$$|Mt| \leq Dp/Ds = 0.18 \quad (12)$$

where it is assumed that Ds=60 nm. This conditional expression is rewritten as follows using the equation 6.

$$|Mt| = (Vo/Vi)^{1/4}(Li/Lo)|L1/L2| \leq 0.18 \quad (13)$$

The collimating mode is selected for focusing of the observation beam, partly because of requirement of the beam defining aperture as described later in item (3), and the image point P1 is moved toward the ion source to make a virtual image point so that |L1/L2| becomes smaller. In this arrangement, the condenser lens is made to function mostly as an accelerating device rather than a focusing device. In normal operating condition of Vo=6 to 9 kV and Vm=Vi=25 to 35 kV, L1/Lo=−(1 to 2) and Mc1=1 to 3 are obtained. Accordingly, the following conditional expression is attained for Li/L2 (=Mo1).

$$Li/L2 = Mt/Mc1 \leq (6 \sim 17) \quad (14)$$

By approximating as L2=L−L1=L+(1 to 2)Lo=Lt+(0 to 1)Lo−Li≈Lt−Li, the conditional expression is rewritten as follows.

$$Lt \approx L2 + Li \geq (7 \sim 18) Li \quad (15)$$

In this arrangement, an analytical expression for single-lens system consisting of an objective lens only (see the disclosed prior art 1) can be applied to Hc and it is expressed as follows.

$$|Hc| = 2(L2+Li)/Vavo \approx 2Lt/Vavo \quad (16)$$

From the equations 13 to 16 the following conclusion is obtained for the observation beam.

(5) The condenser lens is made to function mostly as an accelerating device rather than a focusing device, and the beam is focused in the collimating mode where the image point P1 is a virtual image point.

(6) Lt is made longer and Mt is made lower so that Lt≧(7 to 18)Li applies.

(7) The total optical path length Lt is made shorter to lower |Hc|.

(3) Beam defining aperture

Position and aperture size of the beam defining aperture are examined hereunder. For the milling beam, it is necessary to change the beam diameter in a wide range covering about three digits of Ip=several tens of pA to 10 nA by changing the aperture size of the beam defining aperture. For the observing mode, on the other hand, it is necessary to decrease the beam diameter by one digit from the minimum Ip for the milling beam to attain Ip=several pA.

Accordingly, the observation beam requires the smallest aperture size. Although the aperture functions to limit quantity of the beam passing through it, a beam colliding with side walls of the aperture changes to a scattered beam which becomes a thick noise beam on a sample. From a viewpoint of reducing this scattered beam, thickness of the aperture needs to be thinnest possible. On the other hand, the life of the aperture depends upon its thickness because the aperture is etched by an irradiating beam due to sputtering. Accordingly, from a viewpoint of increasing the life of an aperture, thickness of the aperture needs to be thickest possible.

From a viewpoint of the FIB performance, repeatable positioning accuracy of the aperture is required to be almost equal to or less than the aperture size. Incidentally, the repeatable positioning accuracy of an aperture with simple mechanism designed to meet cost reduction requirement is about 10 μm. Accordingly, it is desirable to set the minimum aperture size to 10 μm or greater from a viewpoint of repeatability of the positioning accuracy.

From the three viewpoints above, the following requirement (a) for the position of the aperture arises to allow to obtain higher beam defining performance with larger aperture size. Additional requirements (b) to (d) must also be noted to improve operability of an FIB apparatus. Thus, the minimum aperture size is set to about 10 μm.

(a) The beam defining aperture shall be positioned between the ion source and the sample where the beam diameter is thick.

(b) The beam defining aperture shall be positioned before (at a preceding stage of) the deflector.

(c) Position of the beam defining aperture shall be common to the milling beam and observation beam.

(d) The beam defining aperture shall be positioned in a space of the earth potential.

Figure 5:
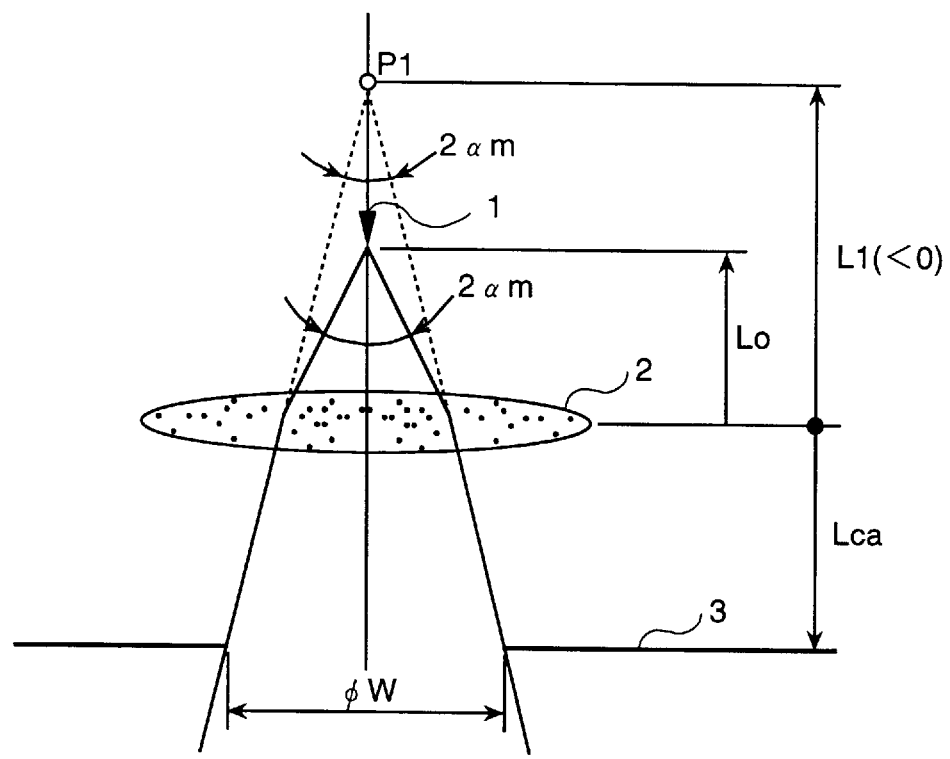
FIG. 5 shows a relation curve of half-angle of the incoming and outgoing beam versus aperture size of the beam defining aperture size of the observation beam in the preferred embodiment of the present invention.

According to the requirements above, it is decided to position the beam defining aperture between the two lenses. It is also found that the collimating mode (L1≈−Lo<0) is suitable to focus the observation beam because the beam is a divergent type between the two lenses. FIG. 5 shows relationship of the half- angle of the incoming and outgoing beams ($\alpha o$ and $\alpha m$, respectively), aperture size W, and distance Lca (>>W) from the condenser lens center to the aperture. The relationship between $\alpha o$ and $\alpha m$ is expressed by the lens formula 7 using the lens magnification Mc1 (see equation 6-a). The relationship between $\alpha m$ and W is expressed by the following equation 18.

$$\alpha o/\alpha m = Mc(Vm/Vo)^{1/2} \quad (17)$$

$$\alpha m = (W/2)/(-L1+Lca) \quad (18)$$

By substituting the above for equation 7 and simplifying the equation, the following equation for the relationship between Ip and W is obtained.

$$Ip = (\pi/4)Ja(Vm/Vo)^{1/2}W^2/\{Lo+Lca/(-L1/Lo)\}^2 \quad (19)$$

In the above equation, −L1/Lo=1 to 2 is obtained when Vo=6 to 9 kV and Vm=25 to 35 kV apply. For example, when the ion source is operated at Ja=20 μA/sr, condition for forming an observation beam of Ip=2 pA through an aperture of W≧15 μm is obtained from equation 19.

Lo+Lca≧55 to 75 [mm]

where the terms on the left side correspond to the distance from the tip of the ion emitter to the beam defining aperture.

The following conclusion about the position of the aperture is obtained from the above study.

(8) The aperture shall be positioned between the two lenses so that Lo+Lca≧55 to 75 (mm) is obtained.

To meet respective requirements (1) to (3), (5) to (7), and (8) of the milling beam, observation beam, and beam defining aperture, Lo=15 to 45 mm, Li≦10 to 40 mm, and Lca=80 mm are specified in the first apparatus of the embodiment of the present invention. The total optical path length is Lt=300 to 450 mm.

How to obtain these data will be explained using FIG. 1 as follows;

As both of the condenser lens and the objective lens are in an electrostatic type, thickness of the lenses should be not less than 15 mm considering at least 20 kV of the accelerating voltage. A space for extracting the ion from the ion source to the condenser lens where the ion extraction voltage is from 6 to 9 kV is needed. Therefore, the minimum value 15 mm as the optical path length Lo is obtained by summing the space distance for the extracting voltage and a half of the lens thickness.

On the other hands, the distance from the condenser lens to the sample should be more than a space for bending the moving orbit of the charged particle towards transverse direction for detecting the charged particle such as secondary electron or secondary ion and a separating distance for obtaining at least 100 μm as a practical deflection distance of the beam on the sample.

Therefore, the optical path length L1 becomes at least 10 mm obtained as a sum of the space distance and the half of the lens thickness.

Furthermore, the optical path length (Lo+Lca) from the ion source to the beam defining aperture becomes at least 55 mm in order to satisfying the requirement (8).

The optical path length from the ion source to the beam defining aperture becomes at least about 245 mm and is obtained as a total sum of minimum value 10 mm of the optical path length Li, the distance between the aligner/stigmator, the blanker and the deflector, and the half of the thickness of the condenser lens. Therefore, the total optical path length Lt from the ion source to the sample becomes at least about 300 mm.

On the other hand, in the case that the optical path length Lo, Li and Lt are maximum, the following data are obtained according to the requirements (2), (3) and (7);

Jmax≧15 A/cm² relating to the manufacturing beam,

Dp≦40 nm when Ip=several tens of pA in the finishing manufacturing beam, and

Dp≦15 nm when Ip≧1 pA in the observing beam.

Practically, they are obtained as Jmax=45 mm, Dp=40 mm (Ip=several tens of pA), and Dp=450 mm(Ip≧1 pA).

Figure 6:
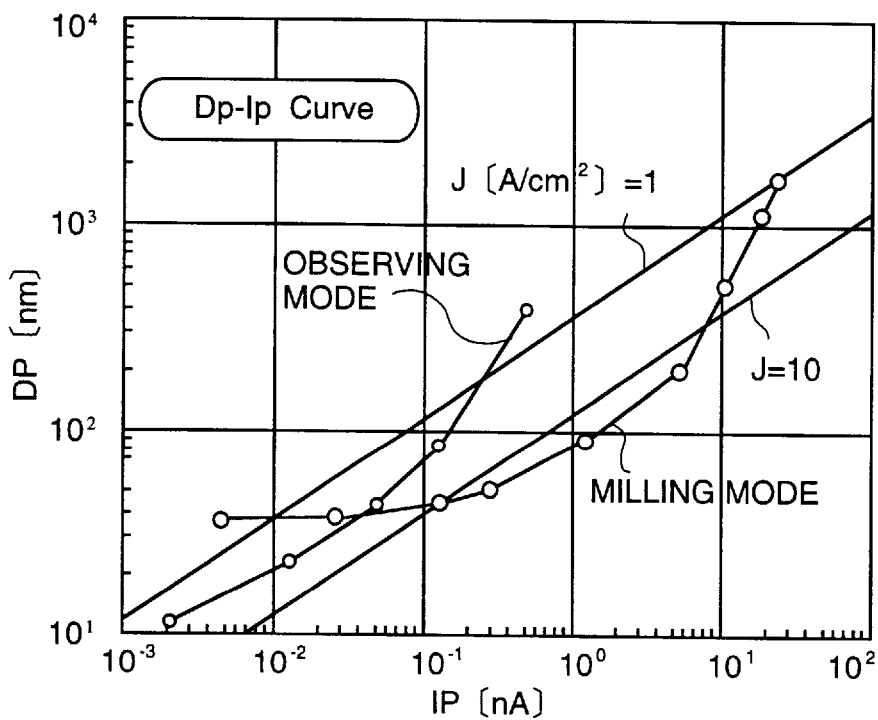
FIG. 6 shows a characteristic curve of beam diameter versus beam current (Dp-Ip) of the FIB apparatus in the preferred embodiment of the present invention.

The typical Dp-Ip characteristic curve of the above device when Vi=30 kV is shown in FIG. 6.

Although Jmax is increased when Vi is increased, higher Vi results in higher applied voltage to the lenses and consequently cost of the ion source and accelerating power source increases. In addition, under the same deflection voltage, a range to be scanned by the beam on a sample become narrower in reverse proportion to Vi. Accordingly, the maximum value of Vi is 40 kV from a viewpoint of practical use. In particular, when it was required to scan a beam in a wide range to observe an SIM image in a wide field, for example, Vi which is normally 30 kV was lowered one-half to 15 kV and the maximum beam scanning distance was doubled (area of the visual field was increased by four times). It is found, however, that lowering Vi further below 15 kV is not very practical because the image resolution is deteriorated drastically and also because generating efficiency of the secondary electron, which is detected for creating an image, becomes lower. From a viewpoint of milling, however, Vi needs to be above 20 kV to increase sputtering yield. In view of the above, Vi is set to a range of 20 to 40 kV.

The deflector is positioned in two different methods. One is a succeeding deflection method, where the deflector is positioned just after the objective lens. The other is a preceding deflection method, where the deflector is positioned just before the objective lens. The former method is available only when Li is long but the latter method is available even if Li is short. For the latter, it is necessary to let the beam pass through the center of the objective lens regardless of amount of deflection. For this reason, the deflector needs to be a two-stage type and more complicated structural design and electrical control are required, which is disadvantageous. However, when it is particularly necessary to increase Jmax and narrow the fine milling beam, employing the preceding deflection method with shorter Li is advantageous.

Because the lens voltage of an electrostatic lens increases as Vi (=Vm) increases under the same focusing length, gap between the lens electrodes must be widened. However, because aberration of lens is in inverse proportion to the average lens voltage (Vav)(see equation 10), it is important to design and produce a thin lens having smallest possible gap.

The second apparatus of the embodiment of the present invention is exactly the same as the above-described first apparatus of the embodiment except that Lo is changed to 45 to 80 mm and Lca to 130 mm. Beam characteristic of the second apparatus as compared to that of the first apparatus is that Jmax is slightly lower but that the fine milling beam can be narrowed much more. This result can also be anticipated from equations 10 and 11. Because Jmax and the minimum beam diameter trade off each other, it is advantageous to set Lo longer if importance is particularly attached to the minimum beam diameter.

The third apparatus of the embodiment of the present invention is exactly the same as the above-described first apparatus of the embodiment except that Lt is changed to 550 mm. Beam characteristic of the third apparatus as compared to that of the first apparatus is that Jmax is slightly lower but that much finer beam diameter can be realized because the lens magnification of the observation beam can be decreased further. This is particularly advantageous for observing high resolution SIM image.

In the preferred embodiment of the present invention as compared to the prior art, the maximum current intensity Jmax is increased by more than 50% and the beam diameter is narrowed by about 20% for the fine milling beam and by more than 50% for the observing mode. This improvement makes it possible to conduct FIB milling to higher accuracy at higher speed and observe SIM image in higher resolution, thus enabling to conduct failure analysis and process evaluation of functional fine elements to higher accuracy and for greater throughput. In particular, reliability in sample preparation for transmission electron microscope is remarkably improved because yield of sample preparation is improved from about 70% in the past to 90% or higher.

The improved beam characteristic of the present invention helps achieve high positioning accuracy, high throughput and high reliability not only in the above-described failure analysis and process inspection but in device modification employing wire cutting by FIB milling and wire connection by FIB-assisted deposition.

Figure 7:
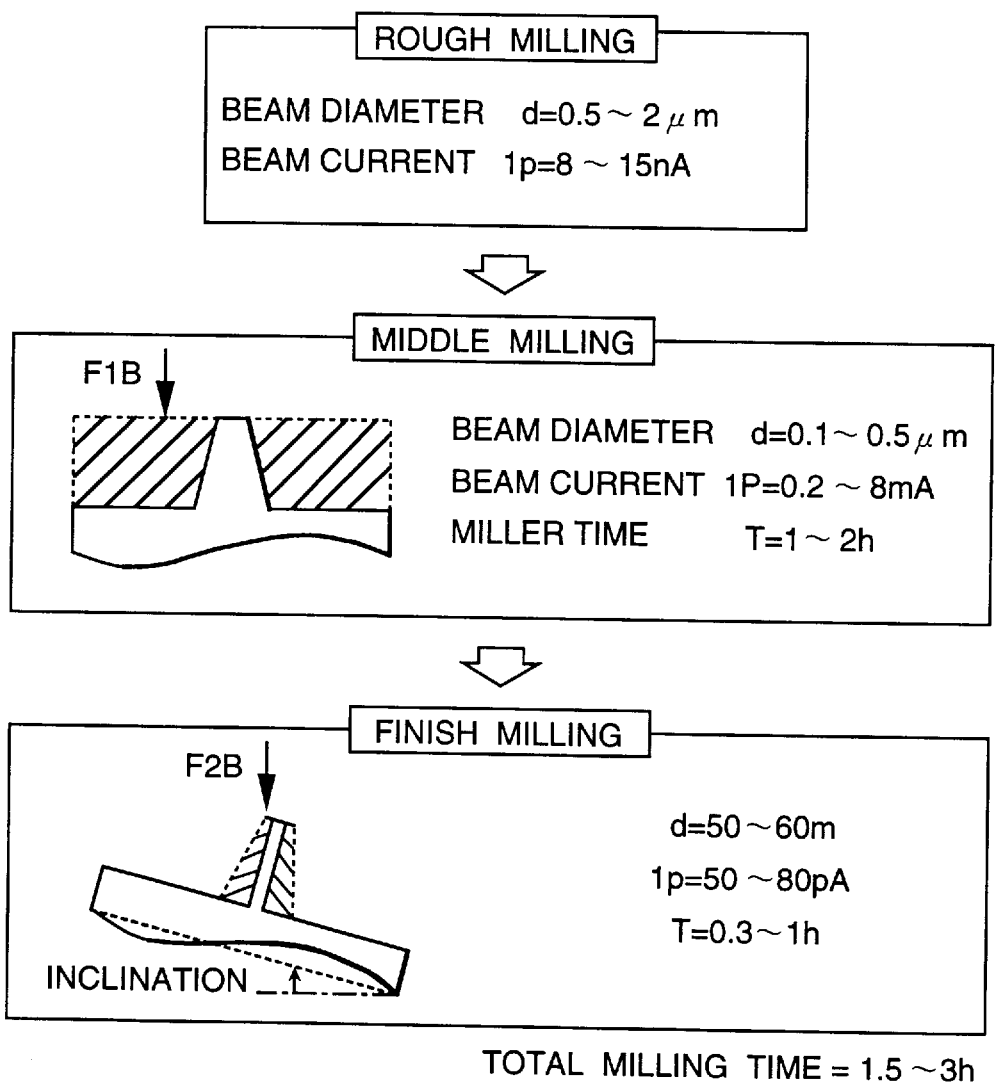
FIG. 7 shows the FIB sample preparation procedure for a TEM sample and sectional figure of the sample.

Preparation of samples for transmission electron microscope (TEM) using localized sectional milling with FIB is presented. FIG. 7 shows procedure for the FIB milling. First, a sample is milled across two sections by the rough milling beam so that a thin film of several pm thick including a portion to be subjected to TEM observation is left over. Then, the sample is further milled by the medium milling beam and fine milling beam until thickness of the film gets to about 0.1 $\mu$m (=100 nm) or less. Dp and Ip for the rough, medium, and fine milling are 0.5 to 2 $\mu$m and 8 to 15 nA, 0.1 to 0.5 $\mu$m and 0.2 to 8 nA, and 50 to 60 nm and 50 to 80 pA, respectively. Time required for the medium milling is 1 to 2 hours and that for the fine milling is 0.3 to 1 hour. Total hours of milling including the rough milling are 1.5 to 3 hours. Section of the thin film sample after final finish is checked by SIM observation using much finer observation beam, and then the sample is subjected to the TEM observation.

Taking the above-described fine milling as a typical example, problems of the apparatus using the prior art will be explained hereunder. Comparing the FIB of the apparatus to a blade of a cutter, thickness of the blade is half as thick as a thin film sample that needs to be left over after both ends of the sample are cut off. For this reason, it is a problem that cut end of the thin film sample may not be sharp and, if the blade moves during cutting, the thin film sample is damaged and lost. Particularly in failure analysis, no cutting error is permissible because there is only one position that is to be cut open. Improved milling reliability of the apparatus is keenly desired.

It is understood that positioning accuracy of the FIB milling is in proportion to Dp and milling speed is in inverse proportion to Ip. Therefore, increase of the FIB current intensity contributes to high accuracy milling and high speed milling. That is to say, if Dp is the same (positioning accuracy of milling is the same), the milling speed is faster and milling can be completed in a shorter time when Ip is greater. On the other hand, if Ip is the same (milling speed is the same), positioning accuracy of the milling is higher when Dp is smaller. Reduced milling time contributes to the positioning accuracy of final finish because shorter milling time helps reduce drift of beam position and sample stage. Further, finer beam diameter improves image resolution and higher Ip improves image quality in the SIM image observation.

Recent functional elements begin to employ finer patterns and three-dimensional structure. Accordingly, it is essential in failure analysis and process evaluation to conduct sectional milling and structural observation at a required portion of a sample. Since there is no other apparatus than an FIB apparatus available at present that can serve the purpose, the FIB milling to higher accuracy at higher speed and SIM image observation in higher resolution are keenly desired.

As described above, the present invention brings an effect of enabling to realize failure analysis of semiconductors.

What is claimed is:

1. A focused ion beam apparatus, comprising:

an ion source having an emitter emitting an ion beam;

a condenser lens and objective lens set for focusing the emitted ion beam from said ion source on a sample;

a deflector for scanning said focused ion beam on said sample; and a beam defining aperture for defining said focused ion beam, wherein an optical path length from a tip of the emitter of said ion source to said sample is within a range of from 450 mm and a distance from the center of said objective lens to said sample is 40 mm or less and wherein the optical path length from the tip of the emitter of said ion source to said condenser lens center is 45 mm or less.

2. A focused ion beam apparatus, comprising:

an ion source having an emitter emitting an ion beam;

a condenser lens and objective lens set for focusing the emitted ion beam from said ion source on a sample;

a deflector for scanning said focused ion beam on said sample; and a beam defining aperture for defining said focused ion beam, wherein an optical path length from a tip of the emitter of said ion source to said sample is within a range of from 450 mm and a distance from the center of said objective lens to said sample is 40 mm or less and wherein said beam defining aperture is located on the optical axis between said condenser lens and said objective lens and also located apart from the tip of said emitter by 55 mm or more.

3. A focused ion beam apparatus, comprising:

an ion source having an emitter emitting an ion beam;

a condenser lens and objective lens set for accelerating and focusing the emitted ion beam from said ion source onto a sample;

a deflector for scanning said focused ion beam on said sample; and a beam defining aperture for defining a beam current or a beam diameter of said focused ion beam, wherein an optical path length from a tip of the emitter of said ion source to the center of said condenser lens is 45 mm or less, a distance from the center of said objective lens to said sample is 40 mm or less, and said beam defining aperture is located on the optical path between said condenser lens and said objective lens and also located apart from the tip of said emitter by 55 mm or more.

4. A focused ion beam apparatus, comprising:

an ion source; and a lens for focusing an ion beam from said ion source coming through said lens onto a sample, wherein the ion beam is controlled to have a maximum current density (Jmax)$\geq$15 A/cm$^2$, and a beam diameter (DP)$\leq$40 nm at a beam current (IP)$\geq$tens of pA in a milling mode and a beam diameter (DP)$\leq$15 nm at a beam current (IP)$\geq$1 pA in an observing mode, by an observing means.

5. A method for irradiating a focused ion beam comprising the steps of:

extracting the ion beam from an ion source;

focusing the ion beam through a lens; and irradiating the ion beam onto a sample, wherein the ion beam is controlled to have a maximum current intensity (Jmax)$\geq$15 A/cm$^2$, and a diameter (DP)$\leq$40 nm at a beam current (IP)$\geq$tens of pA in a milling mode and a beam diameter (DP)$\leq$15 nm at the a current (IP)$\geq$1 pA in an observing mode.

* * * * *